United States Patent [19]

Shirasu

[11] Patent Number: 4,880,308
[45] Date of Patent: Nov. 14, 1989

[54] ALIGNING APPARATUS
[75] Inventor: Hiroshi Shirasu, Yokohama, Japan
[73] Assignee: Nikon Corporation, Tokyo, Japan
[21] Appl. No.: 176,760
[22] Filed: Apr. 1, 1988
[30] Foreign Application Priority Data
  Apr. 8, 1987 [JP] Japan ................................ 62-86636
[51] Int. Cl.$^4$ .............................................. G01B 11/00
[52] U.S. Cl. ..................................... 356/401; 250/548
[58] Field of Search ....................... 356/399, 400, 401; 250/548, 557, 561; 358/101

[56] References Cited
U.S. PATENT DOCUMENTS
  4,251,160  2/1981  Bouwhuis et al. ................... 356/401

Primary Examiner—F. L. Evans
Attorney, Agent, or Firm—Shapiro and Shapiro

[57] ABSTRACT

An apparatus for aligning a first substrate with a second substrate, comprising: means for relative movement of first and second substrates, first alignment mark means an first substrate, second alignment mark means an second substrate to be optically superposed with first alignment mark means, illumination means for instantaneously illuminating first and second alignment mark means, means for measuring the relative position of the first and second substrates in synchronization with instantaneous illumination by the illumination means, alignment optical system for forming images of first and second alignment mark means, determination means for determining positional deviation between first and second substrates from the charge distribution accumulated in images sensor means corresponding to the images of first and second alignment mark means and from the relative position measured by position measuring means, and means for driving the relative movement means according to the positional deviation.

17 Claims, 3 Drawing Sheets

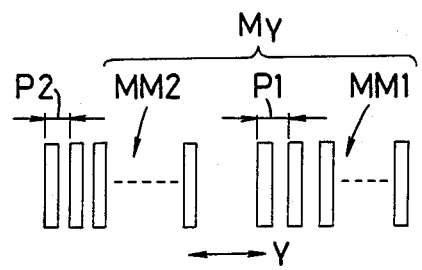
FIG. 2A
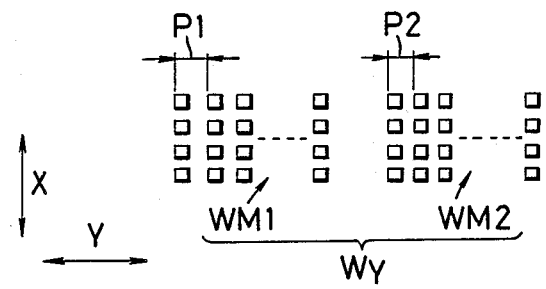
FIG. 2B
FIG. 3
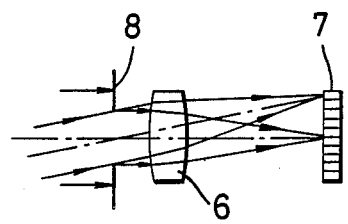
FIG. 4
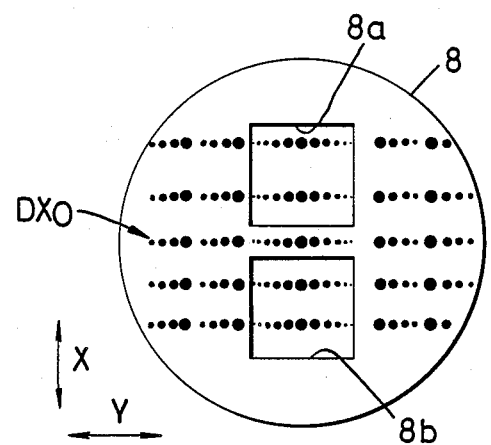

ALIGNING APPARATUS

BACKGROUND OF THE INVENTION

1. Field of the Invention

The present invention relates to an aligning apparatus for mutually aligning a first substrate with a second substrate, and more particularly to an aligning apparatus adapted for use, for example, in an exposure apparatus for semiconductor device manufacture.

2. Related Background Art

For use for example in an exposure apparatus, the U.S. Pat. No. 4,251,160 discloses an aligning apparatus utilizing grating marks both on a mask constituting a first substrate, and a wafer constituting a second substrate. Also there is known an aligning apparatus in which the mask and the wafer have grating marks of mutually different pitches, and the alignment of the mask and wafer is achieved by detecting the position of a moiré fringe pattern, generated by optically superposing said grating marks, with an image sensor. Though such known apparatus can detect a very small displacement with a high precision, fetching of the image information of the moiré fringe pattern requires a certain time due to the limitation in the clock frequency of the image sensor, so that, in case of an aligning operation of an object in motion, the precision of positional measurement is deteriorated due to the movement of said object during said time.

SUMMARY OF THE INVENTION

In consideration of the foregoing, the object of the present invention is to provide an aligning apparatus in which the aligning precision is not affected, in the course of aligning a first substrate with a second substrate, by movement or vibration of a table supporting said second substrate.

The aligning apparatus of the present invention for mutual alignment of a first substrate with a second substrate, which are capable of mutual displacement, is featured by a movable table for moving at least either of said first and second substrates; first alignment mark means formed in predetermined position on said first substrate and composed of a pair of mutually different grating marks; second alignment mark means formed in predetermined position on the second substrate and composed of pair of grating marks constructed in opposite direction to said first alignment marks in such a manner that two moiré fringe patterns, formed by optically superposing said second alignment marks with said first alignment marks, move in mutually opposite directions; illumination means for instantaneously illuminating (pulse illumination) said first and second alignment mark means; position reading means for reading the relative position of said first and second substrates in synchronization with said instantaneous illumination by said illumination means; moiré fringe pattern detecting means containing a charge-accumulating image sensor for detecting the position of said two moiré fringe patterns; an alignment optical system for guiding the images of said two moiré fringe patterns to the image sensor; calculation means for calculating the phase difference of said two moiré fringe patterns from the information on said moiré fringe patterns accumulated in said moiré fringe pattern detecting means and further calculating a positional deviation between the first and second substrates from thus calculated phase difference and from the value read by said position reading means; and driving means for moving said movable table according to the result of said calculation.

In the above-explained apparatus of the present invention, the alignment mark means on the first substrate is superposed with that on the second substrate by the movement of the movable table. Two moiré fringe patterns, formed by a pair of alignment marks on the first substrate and a pair of alignment marks on the second substrate, instantaneously illuminated by the illuminating means, move in mutually opposite directions in response to the movement of the object. Said two moiré patterns are guided through the alignment optical system to the charge-accumulating image sensor and stored therein as the moiré fringe pattern information. On the other hand, the position of the movable table, or the relative position of the first and second substrates, is read by the position reading means in synchronization with the instantaneous illumination by the illuminating means. The stored moiré fringe pattern information is supplied to the calculating means which calculates the phase difference of two moiré fringe patterns and further calculates the positional difference between the first and second substrates, from the value read by the position reading means and from the calculated phase difference. The first and second substrates can be mutually aligned by moving the movable table by thus determined positional difference.

Thus, according to the present invention, the precision of measurement is not affected at all by an eventual positional error of the image sensor, since paired alignment marks on the first substrate and those on the second substrate are so formed that two moiré fringe patterns obtained by respectively superposing said alignment marks move in mutually opposite directions and said moiré fringe patterns are detected by the image sensor. Also the relative position of the first and second substrates is determined in synchronization with the instantaneous illumination to enable measurements of said mutual position in succession during mutual movement thereof, thereby allowing rapid and highly precise alignment.

Other objects of the present invention and the advantages thereof will become fully apparent from the following description, which is to be taken in conjunction with the attached drawings.

BRIEF DESCRIPTION OF THE DRAWINGS

FIG. 2A is a magnified plan view of alignment marks formed on a mask shown in FIG. 1;

FIG. 2B is a magnified plan view of alignment marks formed on a wafer shown in FIG. 1;

FIG. 3 is a schematic view showing the light path of a moiré fringe pattern detecting unit shown in FIG. 1, seen from a direction A;

FIG. 4 is a schematic view showing the separation of diffracted light by a spatial filter;

DETAILED DESCRIPTION OF THE PREFERRED EMBODIMENTS

Figure 1:
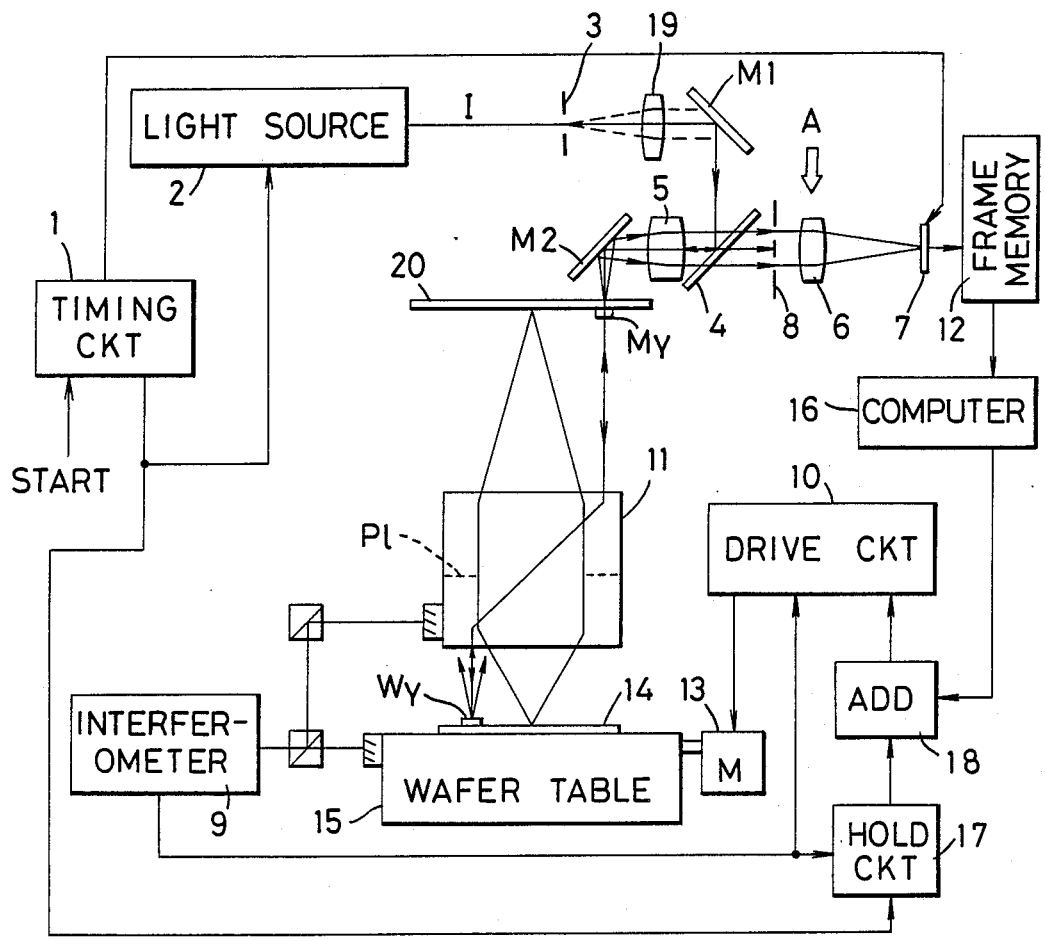
FIG. 1 is a block diagram of an embodiment of the present invention applied to a projection exposure apparatus.

FIG. 1 shows an embodiment of the present invention, applied to a projection exposure apparatus. A light beam I, for illuminating the alignment marks, emitted from a pulse light source 2 activated by a signal from a timing circuit 1 to be explained later, is guided through a field stop 3, a lens 19, a mirror M1, a half mirror 4, an objective lens 5 and a mirror M2 and illuminates alignment marks MY on a mask 20. The field stop 3 limits the areas illuminated on the mask 20. The images of the mask marks MY are projected onto a wafer 14 by a projection lens 11. Said mask marks MY are formed as grating patterns consisting of mutually parallel plural reflecting portions and transmitting portions (slits), and is composed of a grating mark MM1 having a grating pitch P1 in a measuring direction Y when projected onto the wafer 14, and a grating mark MM2 having a grating pitch P2 in a similar manner. The alignment marks WY on the wafer are composed of a pair of marks WM1, WM2 each consisting of plural rectangular projections arranged in a matrix as shown in FIG. 2B, wherein the mark WM2 has a grating pitch P2 in the measuring direction Y while the mark WM1 has a grating pitch P1 in said direction. The above-mentioned marks are so arranged that the mask mark MM1 superposes with the wafer mark WM2 through the projection lens 11, and the mask mark MM2 simultaneously superposes with the wafer mark WM1. The light projecting the images of the mask marks onto the wafer 14 is reflected by the surface thereof, and generates, upon illuminating the rectangular projections of the wafer marks, diffracted light in a direction X perpendicular to the measuring direction Y, depending on the arrangement of said rectangular projections in said direction X. The reflected and diffracted light is again transmitted through the projection lens and the slits of the mask marks MY, then guided through the mirror M2, objective lens 5 and half mirror 4, and is focused through a spatial filter 8 and an imaging lens 6 onto an image sensor 7. Simultaneously the images of the mask marks on the mask 20 are formed on the image sensor 7. However the spatial filter 8 positioned conjugate with the pupil P1 of the projection lens 11 intercepts the normal reflected light from the wafer 14 and from the mask 20, thus allowing the diffracted light only, generated by the wafer marks WY in the direction X, to reach the image sensor 7 as will be explained further in the following with reference to FIG. 4.

Figure 5:
FIG. 5 is a plan view showing moiré fringe patterns on an image sensor shown in FIG. 1.

The spatial filter 8 intercepts the normal reflected light from the wafer and a light portion $D_{x0}$ entering the mask from the mirror M2 and diffracted by the mask marks MY, so that only the light beams diffracted by the wafer marks WY in the direction X and further diffracted by the mask marks MY, thus forming moiré fringe patterns, are transmitted by apertures 8a, 8b and reaches the image sensor 7 through the imaging lens 6. Thus a moiré fringe pattern, consisting of light and dark portions as shown in FIG. 5, is formed by the difference in grating pitch $(p_1-p_2)$ of the mask marks MY and the wafer marks WY in the measuring direction Y, on the image sensor 7. The positional deviation between the mask 20 and the wafer 14 is determined by measuring the position of said moiré fringe pattern by means to be explained later.

When the mask 20 and the wafer 14 are mutually superposed with an error not exceeding $\pm\frac{1}{2}$ of the grating pitch of the aligning grating marks MY, WY by an unrepresented crude aligning system such as a global alignment optical system, for example employed in a reduction projection exposure apparatus (stepper), a start signal for starting fine alignment is given to the timing circuit 1, which, in response, scans the image sensor 7 to dissipate the charge accumulated thereon. Then the timing circuit 1 sends a trigger signal to the light source 2 for pulse illumination and a hold circuit 17 which holds the value read by an interferometer 9 for measuring the position of a wafer table 15 movable with the wafer 14 placed thereon, thereby causing light emission from the pulse light source 2 and causing the hold circuit 17 to read the position of the wafer table 15. The aligning marks MY. WY illuminated by the pulse light generate moiré fringe patterns by diffraction on the image sensor 7, and the information of said patterns is stored in the form of charges on the image sensor 7. In said patterns, the high-order pitch components are removed by the spatial filter 8 as shown in FIGS. 3 and 4. FIG. 5 shows the moiré fringe patterns of the alignment marks, formed on the image sensor 7, in which MA indicates a moiré fringe pattern obtained by superposing of the mask mark MM1 and the wafer mark WM2, while MB indicates a pattern obtained by superposing of the mask mark MM2 and the wafer mark WM1. If the alignment marks MM1, MM2, WM1 and WM2 have grating pitches satisfying a condition P1>P2, the moiré fringe pattern MA moves in the same direction as the moving direction of the wafer 14, while the pattern MB moves in the opposite direction. On the other hand, if P1<P2, the pattern MB moves in the same direction as the moving direction of the wafer 14 while the pattern MA moves in the opposite direction. The positions of said moiré fringe patterns MA, MB are read from the image sensor 7 to a frame memory 12, and a computer 16 executes a Fourrier analysis to extract the basic frequency components of the moiré fringe pattern, and to determine the phase angles thereof. Said extraction of basic frequency components removes noises different from the frequency of the moiré fringe patterns, such as caused by unevenness in the sensitivity of illumination of the image sensor, thus improving the precision of position reading.

The computer 16 determines the phase angle $\phi_A$ of the moiré fringe pattern MA and that $\phi_B$ of the pattern MB as represented by:

$$\phi_A = \phi_1 + \phi_0 + \Delta\phi$$

$$\phi_B = \phi_2 + \phi_0 + \Delta\phi$$

wherein $\phi_0$ is a phase angle with respect to a reference point on the image sensor 7 when the mask 20 and the wafer 14 are mutually aligned to a desired position; $\Delta\phi$ is a change in the phase angle resulting from a movement of the image sensor 7; and $\phi_1$, $\phi_2$ are phase angles of the moiré fringe patterns MA, MB corresponding to the movement of the wafer 14 with respect to the mask 20. Thus the amount of relative movement between the mask 20 and the wafer 14 can be determined from a difference of the measured phase angles of the patterns MA and MB, namely $\overline{\phi} = \phi_A - \phi_B = \phi_1 - \phi_2$, without depending on the position of the image sensor 7.

More specifically, the basic frequency component of the moiré fringe pattern MA, when the wafer 14 is moved by $Y_0$ with respect to the mask 20, is represented by:

$$\cos\left\{2\pi\left(\frac{1}{P_2}-\frac{1}{P_1}\right)Y+\frac{2\pi Y_0}{P_1}\right\}$$

Similarly the basic frequency component of the pattern MB is represented by:

$$\cos\left\{2\pi\left(\frac{1}{P_2}-\frac{1}{P_1}\right)Y+\frac{2\pi Y_0}{P_2}\right\}$$

so that said difference of phase angles is represented by:

$$\tilde{\phi} = \phi_A - \phi_B = \frac{2\pi}{P_1}Y_0 + \frac{2\pi}{P_2}Y_0$$

Consequently the relative position $Y_0$ of the wafer with respect to the mask is given by:

$$Y_0 = \frac{P_1 P_2}{P_1 + P_2} \times \frac{\tilde{\phi}}{2\pi}$$

An adder 18 calculates the position of the wafer table 15 where the wafer 14 is aligned to the mask 20 at a desired position, from thus determined value $Y_0$ and the position of the wafer table 15 read by the hold circuit 17 from the interferometer 9 at the pulse illumination. Even during said calculation, the position of the wafer table 15 is continuously read by the driving circuit 10 through the interferometer 9, and said driving circuit controls a driving motor 13 so as to move the wafer table 15 to the desired alignment position.

Figure 6:
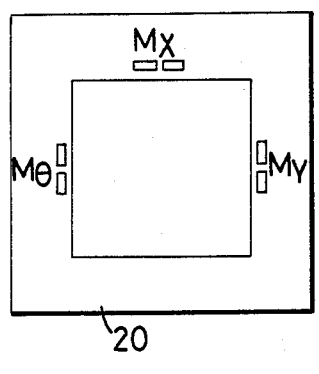
FIG. 6 is a plan view showing the arrangement of alignment marks on a mask.
Figure 7:
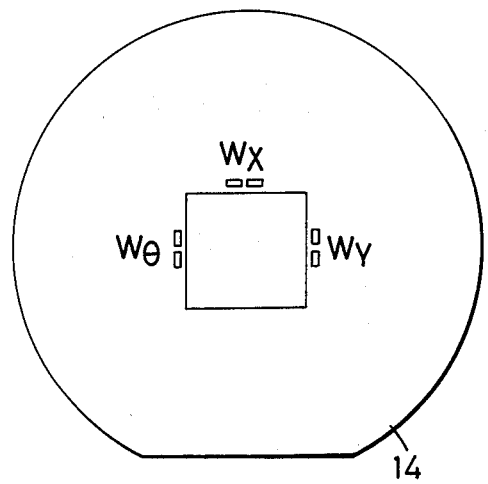
FIG. 7 is a plan view showing the arrangement of alignment marks on a wafer; and o

As shown in FIGS. 6 and 7, alignment marks MX, MY, M0 and WX, WY, W0 are formed, respectively on the mask 20 and the wafer 14, in three positions around the exposure area of a step, and used respectively for measuring the position in the directions X, Y and the rotational direction 0 as indicated by suffixes.

The foregoing explanation relating the FIGS. 1 to 5 is limited to the detection of position in the direction Y, but the alignment can be achieved in the direction X and the rotational direction 0 by similar means. Also it can be confirmed that the mask and the wafer are mutually aligned with a desired precision, by repeating the above-explained procedure. The measurement of position can be conducted while the wafer table 15 is in motion or is stopped, and the mask can be aligned to a desired position of the wafer 14 with a high precision, without influence of the movement or vibration of said table, or of a positional error of the image sensor 7.

Figure 8:
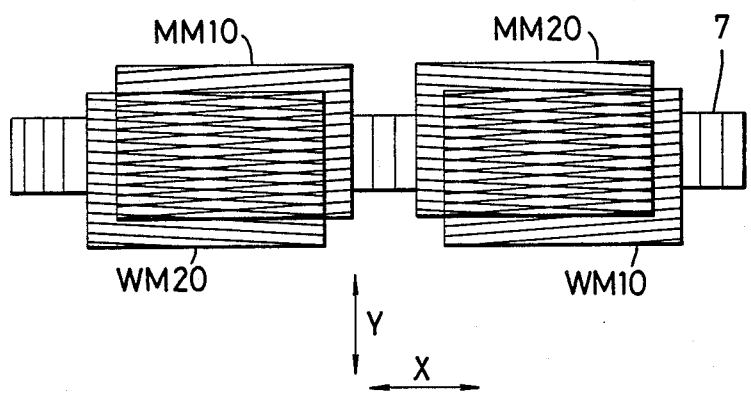
FIG. 8 is a plan view showing a moiré fringe pattern formed with alignment marks different from those shown in FIGS. 2A and 2B.

In place for the grating marks of different pitches employed in the foregoing embodiment, there may also be employed, as shown in FIG. 8, marks MM10, MM20, WM20 and WM10 of a same pitch, formed respectively on the mask and the wafer with mutually opposite slight inclinations to achieve a similar effect. In this case, when the wafer marks WM10, WM20 are moved in the direction Y together with the wafer, the two moiré fringe patterns move in mutually opposite directions X perpendicular to said direction Y. Consequently the image sensor 7 can be placed along said pattern moving direction X.

In an exposure apparatus employing an excimer laser as the light source, a part of the excimer laser beam may be employed as the light source for alignment.

What is claimed is:

1. An apparatus for aligning a first substrate with a second substrate, comprising:
   means for relative movement of said first and second substrates for said alignment;
   first alignment mark means composed of a pair of mutually different grating marks formed in predetermined positions of said first substrate;
   second alignment mark means composed of grating marks formed in predetermined positions of said second substrate to be optically superposed with said pair of grating marks, wherein said grating marks of said second alignment mark means are formed in such a manner that two moiré fringe patterns formed by said optical superposition move in mutually opposite directions during a relative movement of said first and second substrates by said relative movement means;
   illumination means containing a pulse light source for instantaneously illuminating said first and second alignment mark means;
   means for measuring the relative position of said first and second substrates in synchronization with instantaneous illumination by said illumination means;
   image sensor means of charge accumulation type;
   an alignment optical system for forming said two moiré fringe patterns on said image sensor means;
   determination means for detecting the phase difference of said two moiré fringe patterns from the charge distribution accumulated in said image sensor means corresponding to said moiré fringe patterns and determining a positional deviation between said first and second substrates from detected phase difference in the moiré fringe patterns and from the relative position measured by said position measuring means; and
   means for driving said relative movement means according to said positional deviation determined by said determination means.

2. An aligning apparatus according to claim 1, wherein said pair of grating marks of said first alignment mark means comprises mutually different first and second marks and said second alignment mark means comprises a pair of mutually different grating marks, and, when said first alignment mark means is optically superposed with said second alignment mark means, a grating mark of said second alignment mark means corresponding to said first grating mark has a larger grating pitch than that of said first grating mark and the other grating mark of said second alignment mark means corresponding to said second grating mark has a smaller grating pitch than that of said second grating mark.

3. An aligning apparatus according to claim 1, wherein each of said grating marks of said first alignment mark means is composed of a repeating pattern composed of mutually parallel plural linear reflecting portions and translucent portions, and each of said grating marks of said second alignment mark means comprises plural rectangular projections arranged in a matrix.

4. An aligning apparatus according to claim 1, wherein each of first and second alignment mark means comprises a pair of grating marks which are of a same grating pitch and mutually slightly different inclinations, and said paired grating marks of said first alignment mark means are so arranged, when said first and second alignment mark means are optically mutually superposed, to respectively cross the alignment marks of said second alignment mark means.

5. An aligning apparatus according to claim 1, further comprising an imaging optical system positioned between said first and second substrates, wherein said first alignment mark means and said second alignment mark means are positioned mutually conjugate with respect to said imaging optical system.

6. An aligning apparatus according to claim 1, further comprising synchronization means for causing light emission from said pulse light source and storing the relative position measured by said measuring means in synchronization with said light emission, wherein said determination means is adapted to read the distribution of charges accumulated in said image sensor means and to generate a signal corresponding to the difference between a target position and said relative position stored in said synchronization means.

7. An aligning apparatus according to claim 6, wherein said synchronization means comprises a hold circuit for storing the relative position measured as mentioned above, and a timing circuit for sending a trigger signal to said pulse light source and to said hold circuit, and said driving means drives said relative movement means by adding said stored value of said hold circuit and said difference in position determined by said determination means.

8. An aligning apparatus according to claim 7, wherein said image sensor means comprises a frame memory circuit for transferring said charge distribution to said determination means, and said timing circuit scans said image sensor means for releasing the charges accumulated in said image sensor means.

9. An apparatus for aligning a first substrate with a second substrate, comprising:
   means for relative movement of said first and second substrates for said alignment;
   first alignment marks means composed of a pair of mutually different grating marks formed in predetermined positions of said first substrate;
   second alignment mark means composed of grating marks formed in predetermined positions of said second substrate to be optically superposed with said pair of grating marks, wherein said grating marks of said second alignment mark means are formed in such a manner that two moiré fringe patterns formed by said optical superposition move in mutually opposite directions during a relative movement of said first and second substrates by said relative movement means;
   image sensor means of charge accumulation type;
   an alignment optical system for forming said two moiré fringe patterns on said image sensor means;
   means for detecting the distribution of charges generated in said image sensor means corresponding to the image of said moiré fringe patterns;
   determination means for detecting the relative positional relationship of said two moiré fringe patterns from the charge distribution detected by said detecting means and determining a positional deviation between said first and second substrates based on thus detected relative positional relationship; and
   means for driving said relative movement means according to the positional deviation determined by said determination means.

10. An apparatus for aligning a first substrate with a second substrate which are arranged mutually conjugate with respect to an imaging optical system having a pupil, comprising:
    means for relative movement of said first and second substrates for said alignment;
    first alignment mark means composed of a pair of mutually different grating marks positioned in predetermined positions of said first substrate;
    second alignment mark means composed of grating marks formed in predetermined positions of said second substrate to be optically superposed with said pair of grating marks, wherein said grating marks of said second alignment mark means are formed in such a manner that two moiré fringe patterns formed by said optical superposition move in mutually opposite directions during a relative movement of said first and second substrates by said relative movement means;
    illumination means containing a pulse light source for instantaneously illuminating said first and second alignment mark means;
    means for measuring the relative position of said first and second substrates in synchronization with instantaneous illumination by said illumination means;
    image sensor means of charge accumulation type;
    an alignment optical system comprising a spatial filter positioned conjugate with the pupil of said imaging optical system, and adapted to form said two moiré fringe patterns on said image sensor means;
    determination means for detecting the phase difference of said two moiré fringe patterns from the charge distribution accumulated in said image sensor means corresponding to said moiré fringe patterns and determining a positional deviation between said first and second substrates from thus detected phase difference in the moiré fringe patterns and from the relative position measured by said position measuring means; and
    means for driving said relative movement means according to said positional deviation determined by said determination means.

11. An apparatus for aligning a first substrate with a second substrate, comprising:
    means for relative movement of said first and second substrates for said alignment;
    first alignment mark means composed of a pair of mutually different grating marks formed in predetermined positions of said first substrate;
    second alignment mark means composed of grating marks formed in predetermined positions of said second substrate to be optically superposed with said pair of grating marks, wherein said grating marks of said second alignment mark means are so formed to generate two moiré fringe patterns in cooperation with said pair of grating marks when optically superposed as mentioned above;
    illumination means containing a pulse light source for instantaneously illuminating said first and second alignment mark means;
    means for measuring the relative position of said first and second substrates in synchronization with instantaneous illumination by said illumination means;
    image sensor means of charge accumulation type;
    an alignment optical system for forming said two moiré fringe patterns on said image sensor means;

determination means for detecting the phase difference of said two moiré fringe patterns from the charge distribution accumulated in said image sensor means corresponding to said moiré fringe patterns and determining a positional deviation between said first and second substrates from thus detected phase difference in the moiré fringe patterns and from the relative position measured by said position measuring means; and means for driving said relative movement means according to said positional deviation determined by said determination means.

12. An apparatus for aligning a first substrate with a second substrate, comprising:

means for relative movement of said first and second substrates for said alignment;

first alignment mark means formed in predetermined position of said first substrate;

second alignment mark means formed in predetermined position of said second substrate to be optically superposed with said first alignment mark means;

illumination means containing a pulse light source for instantaneously illuminating said first and second alignment mark means;

means for measuring the relative position of said first and second substrates in synchronization with instantaneous illumination by said illumination means;

image sensor means of charge accumulation type;

an alignment optical system for forming respective images of said first and second alignment mark means on said image sensor means;

determination means for determining a positional deviation between said first and second substrates from the charge distribution accumulated in said image sensor means corresponding to said respective images of said first and second alignment mark means and from the relative position measured by said position measuring means; and means for driving said relative movement means according to said positional deviation determined by said determination means.

13. An aligning apparatus according to claim 12, further comprising an imaging optical system positioned between said first and second substrates, wherein said first alignment mark means and said second alignment mark means are positioned mutually conjugate with respect to said imaging optical system.

14. An aligning apparatus according to claim 12, further comprising synchronization means for causing light emission from said pulse light source and storing the relative position measured by said measuring means in synchronization with said light emission.

15. An aligning apparatus according to claim 14, wherein said determination means is adapted to read the distribution of charges accumulated in said image sensor means and to generate a signal corresponding to the difference between a target position and said relative position stored in said synchronization means.

16. An aligning apparatus according to claim 14, wherein said synchronization means comprises a hold circuit for storing the relative position measured as mentioned above, and a timing circuit for sending a trigger signal to said pulse light source and to said hold circuit, and said driving means drives said relative movement means by adding said stored value of said hold circuit and said difference in position determined by said determination means.

17. An aligning apparatus according to claim 16, wherein said sensor means comprises a frame memory circuit for transferring said charge distribution to said determination means, and said timing circuit scans said image sensor means for releasing the charges accumulated in said image sensor means.

* * * * *